(12) United States Patent
Yang et al.

(10) Patent No.: US 6,609,954 B1
(45) Date of Patent: Aug. 26, 2003

(54) METHOD OF PLANARIZATION

(75) Inventors: Ming-Sheng Yang, Hsinchu (TW); Kuen-Jian Chen, Hsinchu Hsien (TW); Juan-Yuan Wu, Hsinchu (TW); Water Lur, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/182,968

(22) Filed: Oct. 29, 1998

(51) Int. Cl.⁷ .................................................. B24B 1/00
(52) U.S. Cl. .............................. 451/37; 451/57; 451/59
(58) Field of Search .............................. 451/36, 37, 28, 451/60, 65, 57, 41, 59

(56) References Cited

U.S. PATENT DOCUMENTS

| | | | | |
|---|---|---|---|---|
| 4,956,313 A | * | 9/1990 | Cote et al. ................. 437/203 |
| 5,516,346 A | * | 5/1996 | Cadien et al. ................. 51/308 |
| 5,540,810 A | * | 7/1996 | Sandhu et al. ............ 156/636.1 |
| 5,676,587 A | * | 10/1997 | Landers et al. ................. 451/57 |
| 5,836,806 A | * | 11/1998 | Cadien et al. ................. 451/41 |
| 5,934,980 A | * | 8/1999 | Koos et al. ................. 451/41 |
| 6,204,169 B1 | * | 3/2001 | Bajaj et al. ................. 438/645 |
| 6,217,416 B1 | * | 4/2001 | Kaufman et al. ............. 451/41 |

* cited by examiner

*Primary Examiner*—Dung Van Nguyen

(57) ABSTRACT

A polarization method that utilizes a chemical-mechanical polishing operation. In the polishing operation, slurry for polishing a metallic layer is first employed to remove a greater portion of the metallic layer. Next, slurry for polishing a dielectric layer and having properties very similar to the metal-polishing slurry is added and mixed together with the slurry for polishing a metallic layer so that the polishing rate for the dielectric layer is increased. Consequently, metallic residues remaining on the dielectric layer are removed and a planar dielectric layer is obtained at the same time.

12 Claims, 4 Drawing Sheets

METHOD OF PLANARIZATION

BACKGROUND OF THE INVENTION

1. Field of Invention

The present invention relates to a method of planarization. More particularly, the present invention relates to a method of forming a metallic plug within an inter-metal dielectric layer by filling metallic material into a via, and then performing a chemical-mechanical polishing (CMP) operation to remove excess metal above the plug and surrounding areas. Once the metallic layer is polished away, metallic residues above the inter-metal dielectric layer are removed by a controlled increase in the polishing rate of the dielectric layer. Consequently, undesirable metallic residues are completely removed and a planar surface is obtained at the same time.

2. Description of Related Art

Amongst the methods of planarizing a surface, chemical-mechanical polishing (CMP) is one of the most important techniques for the global planarization for VLSI or ULSI circuit fabrication. In the process of manufacturing integrated circuit devices, material often has to be removed from the surfaces of intermediate devices one or more times. Furthermore, material layers sometimes have to be planarized before carrying out the next operation. As the number of material removing operations or planarization increases, CMP operations are used more often. Chemical-mechanical polishing operates by pressing the front surface of a wafer down onto a rotating surface on a polishing table, and supplying slurry at the same time.

The slurry normally contains a chemically active component Such as an acid or a base, and a mechanically active component such as abrasive particles made from silicon dioxide. Although the physical mechanism of the polishing action is still not fully understood, the chemical reaction and the mechanical abrasion of its active components has satisfactorily polished and planarized various types of surfaces. Nowadays, CMP methods are frequently applied to the planarization of metallic and dielectric layers.

A conventional method of forming a plug includes the steps of depositing insulating material over an integrated circuit device, and then patterning the insulating layer to form a contact hole or a via opening. Finally, conductive material is deposited to fill the hole or the via so that a vertical interconnect penetrating the insulating layer and linking electrically with a portion of the device in the substrate is formed.

Since metallic conductive material such as aluminum is unable to fill the via or hole satisfactorily, a chemical vapor deposition (CVD) method is normally used to fill the via of hole with tungsten (W). In the process of depositing tungsten into the via, a layer of tungsten also forms over the insulating layer. After the via is completely filled, excess tungsten above the via needs to be removed before aluminum lines are deposited above the insulating layer and the via. An etching back method, for example, a reactive ion etching (RIE) method, can be used to remove the tungsten above the insulating layer.

However, the etching back operation can lead to over-etching, and a portion of the tungsten within the via may be removed to form a recessed cavity. Therefore, subsequently deposited aluminum layer makes poor contact with the tungsten inside the recessed cavity of the via. Furthermore, when the tungsten is etched back, microscopic particles will remain attached to the wafer surface. These attached particles can often lead to undesirable damage of the device. Hence, an alternative method of removing excessive tungsten above an insulating layer, that is, a chemical-mechanical polishing method, is often used.

FIGS. 1A through 1D are cross-sectional views showing the progression of manufacturing steps in producing a plug according to a conventional method. Due to insufficient planarization of the inter-metal dielectric layer, recessed cavities are produced in some areas leading to device problems.

First, as shown in FIG. 1A, patterned conductive lines 112 are formed above a semiconductor substrate 100. The conductive lines 112 are made of aluminum or aluminum alloy. To simplify the drawing. MOS devices and the semiconductor substrate 100 underneath the conductive lines 112 are not fully drawn. Next, a dielectric layer 114, for example, a silicon oxide layer is deposited over the conductive layers 112 and the substrate 100. The dielectric layer 114 is somewhat influenced by the underlying ridge pattern of the conductive lines 112 on the surface of the semiconductor substrate 100, such that the surface of dielectric layer 114 manifests an undulated surface.

Next, as shown in FIG. 1B, planarization of the dielectric layer 114 is carried out. For example, a chemical-mechanical polishing method is used to form a planarized dielectric layer 114a. However, not all areas are planarized and some areas contain recessed cavities 116.

Next, as shown in FIG. 1C, a photoresist layer (not shown in FIG. 1C) is formed over the dielectric layer 114a. The photoresist layer exposes portions of the dielectric layer 114a where via openings will form. Thereafter, the dielectric layer 114a is selectively etched using an etching technique such as a dry etching method. Ultimately, a portion of each conductive line 112 is exposed, forming via openings 126 and a dielectric layer 114b.

In the subsequent step, a glue layer 118 conformal to the dielectric layer 114b is formed and covers the substrate structure Thereafter, a layer of tungsten 120 is formed over the glue layer 118 and completely fills the via openings 126.

Next, as shown in FIG. 1D, a chemical-mechanical polishing operation is carried out using slurry for polishing tungsten. Hence, a portion of the tungsten layer 120 above the dielectric layer 114b is removed, thereby forming tungsten plugs 120a within the via openings 126. However due to the presence of recessed cavities 116 on the surface of the original dielectric layer 114b, residual tungsten 120b is embedded, which makes its removal particularly difficult.

In fact, because the slurry for polishing tungsten has an especially slow removing rate for dielectric layer 114b, residual tungsten 120b entrenched inside the cavities 116 is difficult to be removed by prolonging the chemical-mechanical polishing operation. The residual tungsten 120b within the cavities 116 can affect the quality of a finished device, and may lead to low yield and waste of the silicon wafer.

In light of the foregoing, there is a need to improve the method of planarization.

SUMMARY OF THE INVENTION

Accordingly, the present invention provides a planarization method that utilizes a chemical-mechanical polishing operation. Through increasing and controlling the removal rate of the inter-metal dielectric layer. recessed cavities above the dielectric layer due to an inefficient planarization technique are avoided. Therefore, device problems caused by metallic residues remaining on the dielectric surface can be reduced.

In another aspect, this invention provides a planarization method that utilizes a chemical-mechanical polishing operation. In the polishing operation, slurry especially for polishing a metallic layer is first employed to remove a greater portion of the metallic layer. Next, slurry for polishing a dielectric layer and having properties very similar to the metal-polishing slurry is added and mixed together so that polishing rate for the dielectric layer is increased. Consequently, metallic residues remaining on the dielectric layer are removed and a planar dielectric layer is obtained at the same time.

To achieve these and other advantages and in accordance with the purpose of the invention, as embodied and broadly described herein, the invention provides a method of planarization. The method includes the steps of providing a semiconductor substrate having a first metallic layer, and then forming a dielectric layer over the first metallic layer and the substrate. Next, the dielectric layer is patterned to form a via opening. Thereafter, a second metallic layer is formed over the dielectric layer and fills the via opening. Subsequently, a chemical-mechanical polishing operation using slurry for removing metallic layer is performed to remove most of the second metallic layer above the dielectric layer. Then, slurry for removing dielectric layer is added and mixed with the slurry for removing metallic layer, while the chemical-mechanical polishing operation is continued. Eventually, the dielectric layer is planarized and any residual material from the second metallic layer is removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
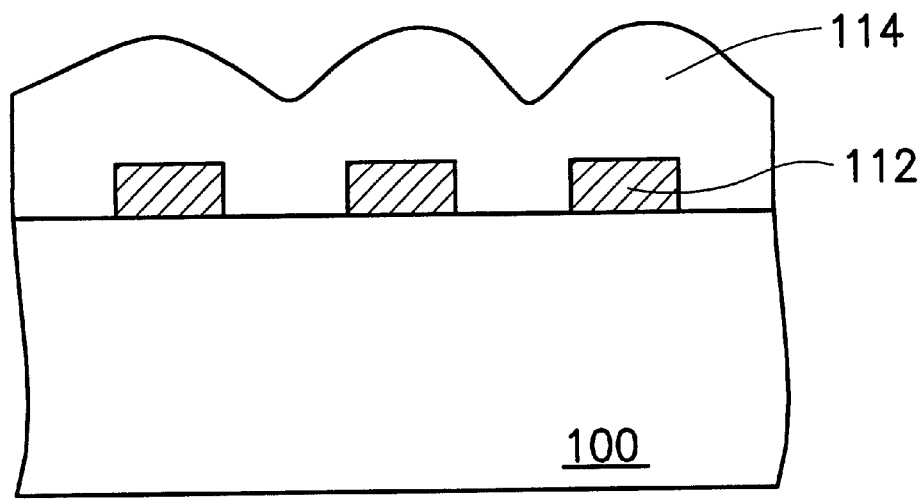
FIGS. 1A through 1D are cross-sectional views showing the progression of manufacturing steps in producing a plug according to a conventional method.
Figure 1B:
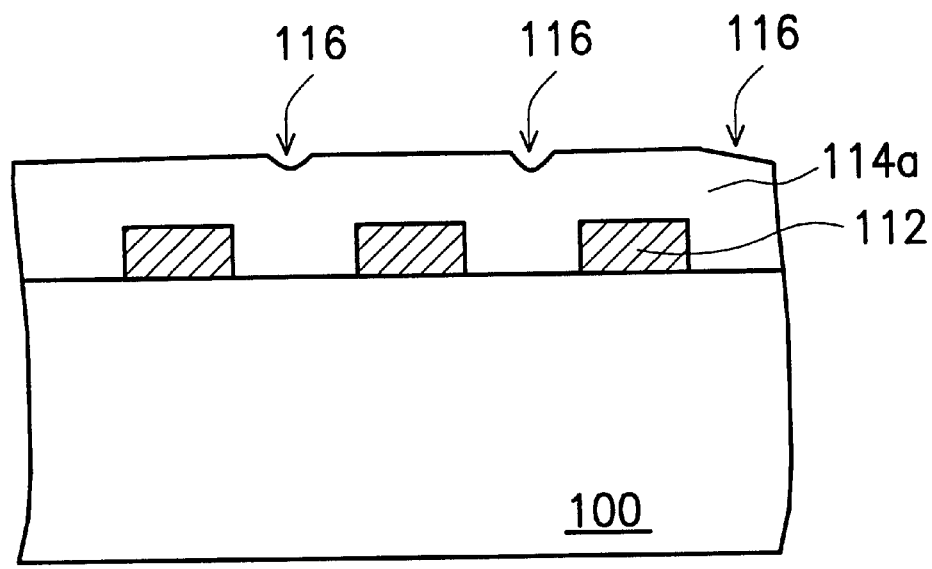
Figure 1C:
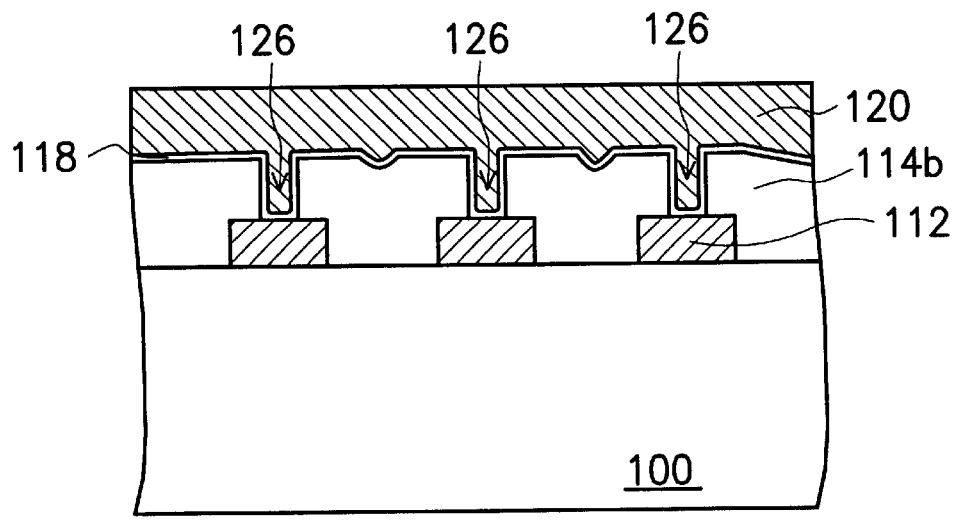

Reference will now be made in detail to the present preferred embodiments of the invention, examples of which are illustrated in the accompanying drawings. Wherever possible, the same reference numbers are used in the drawings and the description to refer to the same or like parts.

Figure 1D:
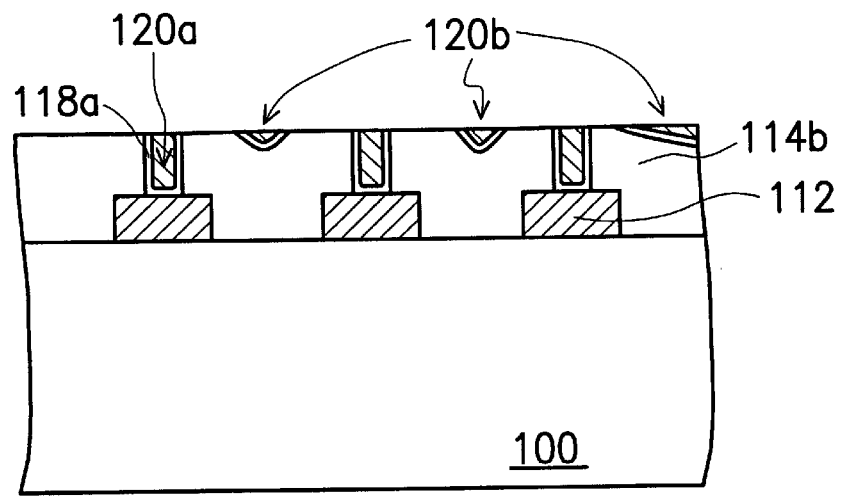

This invention provides a method of removing metallic residues atop an intermetal dielectric layer and planarizing the dielectric layer at the same time. The method is actually a continuation of the conventional process depicted in FIGS. 1A through 1D. By continuing the polishing operation while adding a slurry for removing dielectric layer to the original slurry for removing metallic layer, the dielectric layer 114*b* (indicated in FIG. 1D) is planarized. At the same time, a portion of the dielectric layer 114*b* together with metallic residues 120*b* is removed.

Figure 2:
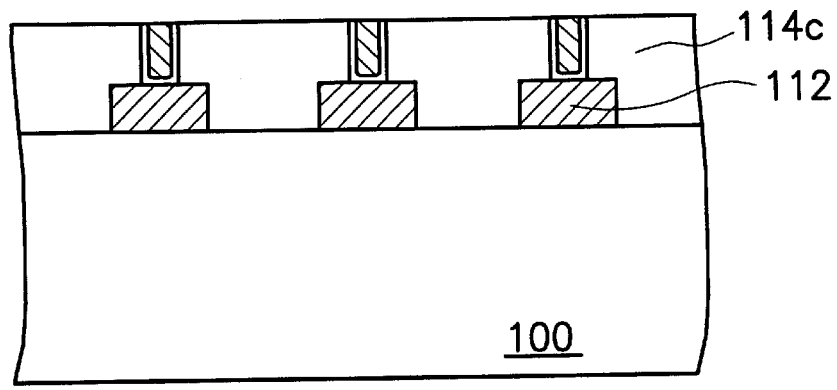
FIG. 2 is a cross-sectional view showing a plug fabricated according to one preferred embodiment of this invention.

FIG. 2 is a cross-sectional view showing a plug fabricated according to one preferred embodiment of this invention. As shown in FIG. 2. the dielectric layer 114*b* is now turned into a dielectric layer 114*c*. Since the dielectric layer 114*b* is probably an oxide layer, the slurry used in the chemical-mechanical polishing operation is for removing oxide. Since operations are carried forward from FIG. 1D, detailed explanations of elements in FIG. 2 are omitted because they are labeled identically.

Because the slurry for removing tungsten layer is present when the slurry for removing dielectric layer is added, physically similar slurries have to be selected. Physical similarity refers to the characteristic of having similar pH value. Therefore, when the two types of slurries are mixed together, unstable conditions due to a difference in pH values will not happen.

In other words, the polishing agents within the slurries will not congeal into lumps that may scratch and damage the wafer. Furthermore, the same type of polishing agents must be used in the two types of slurries, because different polishing agents will have different polishing characteristics. If two or more non-similar types of polishing agents are used at the same time, processing instability may result.

Hence, according to the embodiment of this invention, pH value of the slurry for removing tungsten is around 2.1–2.5, and the polishing agent is silicon dioxide particles with a size of around 200 nm. Similarly, in order to match the slurry for polishing tungsten, the slurry for polishing a dielectric has a pH value of around 2.1–2.5, and the polishing agent is again silicon dioxide particles with a size of around 200 nm.

FIGS. 3A through 3D are cross-sectional views showing the progression of manufacturing steps for producing a plug within an inter-metal dielectric layer having no embedded residual metallic material according to a second preferred embodiment of this invention.

Figure 3A:
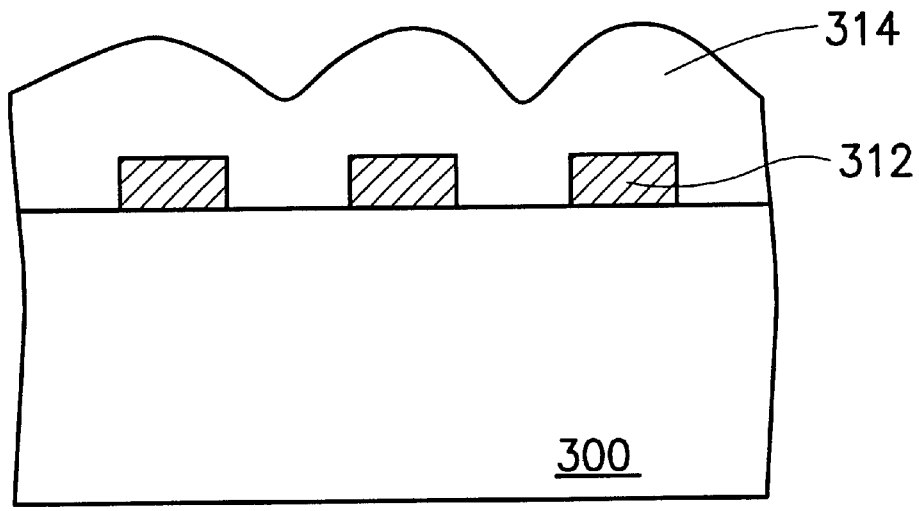
FIGS. 3A through 3D are cross-sectional views showing the progression of manufacturing steps for producing a plug within an inter-metal dielectric layer having no embedded residual metallic material according to a second preferred embodiment of this invention.

First, as shown in FIG. 3A, patterned conductive lines 312 are formed above a semiconductor substrate 300. The conductive lines 312 are made of aluminum or aluminum alloy. To simplify the drawing, MOS devices and the semiconductor substrate 300 underneath the conductive lines 312 are not fully drawn. Next, a dielectric layer 314. for example, a silicon oxide layer, is deposited over the conductive layers 312 and the substrate 300. The dielectric layer 314 is somewhat influenced by the underlying ridge pattern of the conductive lines 312 on the surface of the semiconductor substrate 300, such that the surface of dielectric layer 314 manifests an undulated surface. However, in this embodiment, planarization of the dielectric layer 314 is deferred until after the plug is formed. By this arrangement, one less chemical-mechanical polishing operation can be conducted. Therefore, some wafer processing time is saved.

Figure 3B:
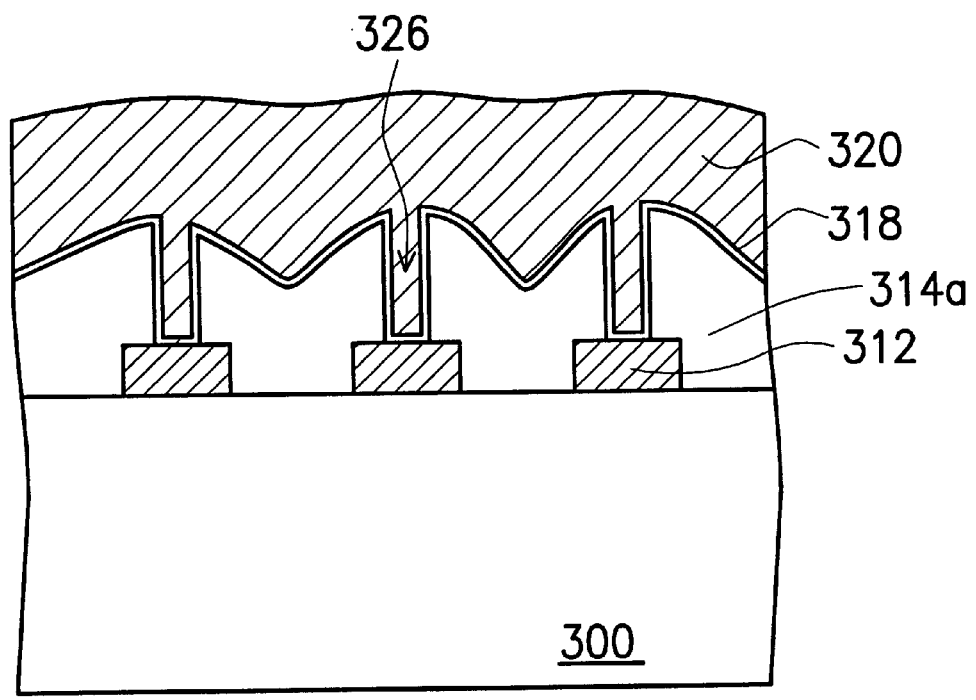

Next, as shown in FIG. 3B, a photoresist layer (not shown in the Fig.) is formed over the uniplanarized dielectric layer 314. The photoresist layer exposes the area where a desired via opening is to be formed. Thereafter, the dielectric layer 314 is selectively etched to form a dielectric layer 314*a* using, for example, a dry etching method. Hence, via openings 326 that expose a portion of the conductive line 312 are formed.

In the subsequent step, a glue layer 318 conformal to the dielectric layer 314a is formed over the substrate structure. Then, a conductive layer 320 is formed over the glue layer 318 and completely fills the via openings 326. Preferably, the conductive layer is a tungsten layer.

Figure 3C:
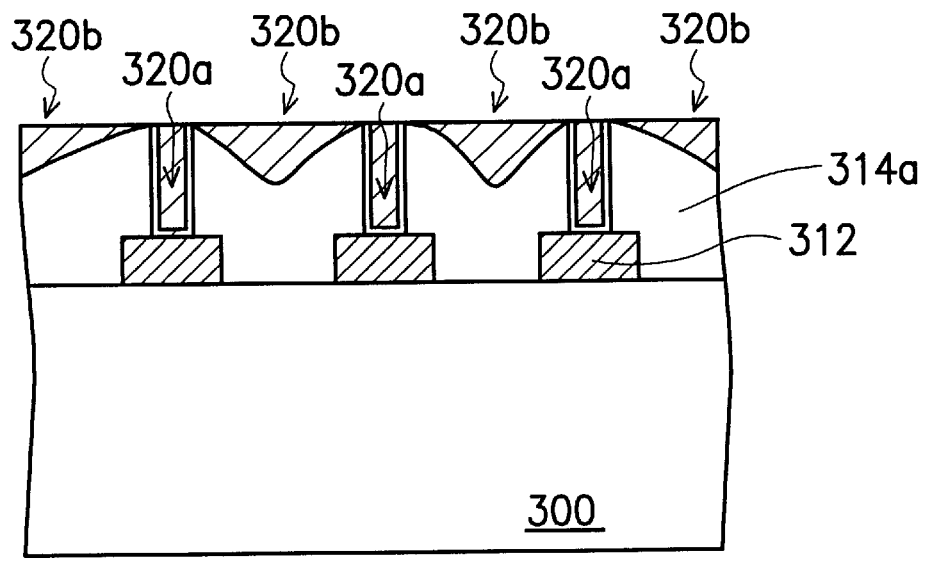

Next, as shown in FIG. 3C, a chemical-mechanical polishing operation is carried out using slurry for removing metal. Preferably, slurry for removing tungsten is used. Consequently, a large portion of the conductive layer 320 above the dielectric layer 314a is removed forming plugs 320a.

Figure 3D:
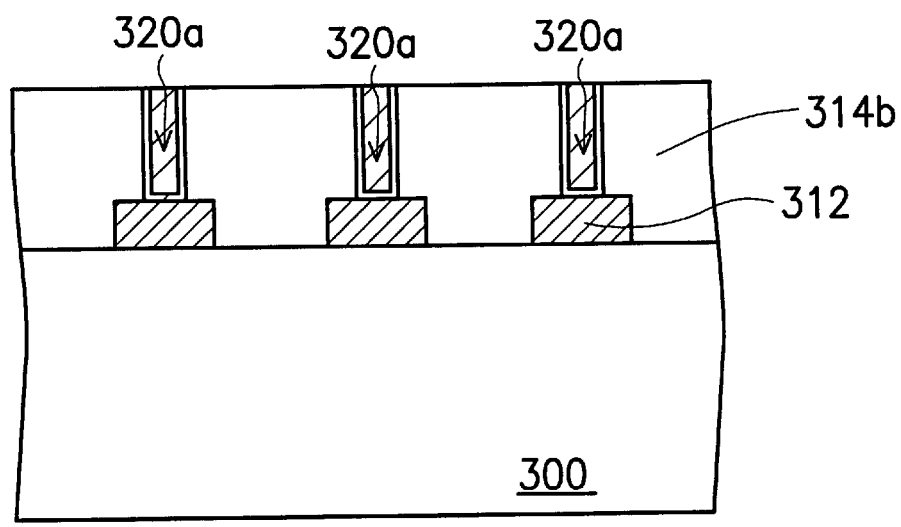

Next, as shown in FIG. 3D, with the slurry for removing metal present, slurry for removing dielectric material is added and mixed together with the original slurry. Subsequently, the chemical-mechanical polishing operation is continued until the dielectric layer 314a is completely planarized and any metallic residues 320b are removed from the dielectric 314a surface.

Because the slurry for removing tungsten layer is present when the slurry for removing dielectric layer is added, physically similar slurries have to be selected. The reason for choosing physically similar slurries has already been explained in the first embodiment. Therefore, in the second embodiment, pH value of the slurry for removing metal is around 2.1–2.5, and the polishing agent is silicon dioxide particles with a size of around 200 nm.

Similarly, in order to match the slurry for polishing a metal, the slurry for polishing a dielectric has a pH value of around 2.1–2.5, and the polishing agent is again silicon dioxide particles with a size of around 200 nm.

Since planarization using a chemical-mechanical polishing method according to this invention is capable of eliminating metallic residues above the surface of a dielectric layer as well as planarizing the dielectric layer, device quality can be greatly improved.

In summary, major aspects of this invention includes:

1. A chemical-mechanical polishing technique is used for planarization. By first polishing away a large portion of a metallic layer with slurry for polishing a metal and then adding another similar slurry for polishing a dielectric, the dielectric layer is planarized and any metallic residues above the dielectric layer are removed at the same time.

2. The slurry for removing metallic material and the slurry for removing dielectric material are very similar in physical properties. They both have a pH value of between 2.1–2.5, and particles of silicon dioxide with a size of around 200 nm are used as polishing agents.

3. After the deposition of an inter-metal dielectric layer, steps in forming a plug can be conducted without the need for performing a planarization operation first. Hence, one less planarization using a chemical-mechanical polishing operation is needed, and some wafer processing time can be saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A planarization method that utilizes a chemical-mechanical polishing operation, the method comprising the steps of:

providing a semiconductor substrate that has a first metallic layer formed thereon;

forming a dielectric layer over the first metallic layer;

patterning the dielectric layer to form a via opening that exposes a portion of the first metallic layer;

forming a second metallic layer over the dielectric layer that completely fills the via opening;

performing a chemical-mechanical polishing operation using a second metallic layer polishing slurry to remove the second metallic layer above the dielectric layer and form a plug inside the opening; and adding a dielectric material polishing slurry without first removing the second metallic layer polishing slurry and then continuing the chemical-mechanical polishing operation until the dielectric layer is planarized and metallic residues of the second metallic layer are completely removed.

2. The method of claim 1, wherein step of forming the second metallic layer includes depositing tungsten.

3. The method of claim 1, wherein a pH value of the second metallic layer polishing slurry and a pH value of the dielectric material polishing slurry are about the same.

4. The method of claim 1, wherein the second metallic layer polishing slurry and the dielectric material polishing slurry contain the same type of polishing agents.

5. The method of claim 1, wherein the second metallic layer polishing slurry has a pH value of between 2.1–2.5, and includes a polishing agent containing silicon dioxide particles with a size of around 200 nm.

6. The method of claim 1, wherein the dielectric material polishing slurry has a pH value of between 2.1–2.5, and includes a polishing agent containing silicon dioxide particles with a size of around 200 nm.

7. The method of claim 1, further comprising planarizing the dielectric layer after forming the dielectric layer.

8. A planarization method that utilizes a chemical-mechanical polishing operation, the method comprising the steps of:

providing a semiconductor substrate that has a first metallic layer formed thereon;

forming a dielectric layer over the first metallic layer;

patterning the dielectric layer to form a via opening that exposes a portion of the first metallic layer;

forming a second metallic layer over the dielectric layer that completely fills the via opening;

performing a chemical-mechanical polishing operation, using a second metallic layer polishing slurry to remove the second metallic layer above the dielectric layer and form a plug inside the opening; and adding a dielectric material polishing slurry without first removing the second metallic layer polishing slurry and then continuing the chemical-mechanical polishing operation until the dielectric layer is planarized and metallic residues of the second metallic layer are completely removed, wherein a pH value of the second metallic layer polishing slurry and a pH value of the dielectric material polishing slurry are about the same.

9. The method of claim 8, wherein step of forming the second metallic layer includes depositing tungsten.

10. The method of claim 8, wherein the second metallic layer polishing slurry and the dielectric material polishing slurry contain the same type of polishing agents.

11. The method of claim 8, wherein the second metallic layer polishing slurry has a pH value of between 2.1 to 2.5, and includes a polishing agent containing silicon dioxide particles with a size of around 200 nm.

12. The method of claim 8, wherein the dielectric material polishing slurry has a pH value of between 2.1 to 2.5, and includes a polishing agent containing silicon dioxide particles with a size of around 200 nm.

* * * * *